United States Patent [19]

Blackham et al.

[11] Patent Number: 5,619,198
[45] Date of Patent: Apr. 8, 1997

[54] NUMBER FORMAT CONVERSION APPARATUS FOR SIGNAL PROCESSING

[75] Inventors: Raymond C. Blackham, Penn Valley; David A. Ohmann; Jeffrey J. Walker, both of Grass Valley, all of Calif.

[73] Assignee: Tektronix, Inc., Wilsonville, Oreg.

[21] Appl. No.: 366,274

[22] Filed: Dec. 29, 1994

[51] Int. Cl.$^6$ .................................................. H03M 7/00
[52] U.S. Cl. ............................................. 341/50; 364/748
[58] Field of Search ..................... 341/50, 106; 364/736, 364/748

[56] References Cited

U.S. PATENT DOCUMENTS 4,589,067  5/1986  Porter et al. ........................... 364/736

Primary Examiner—Brian K. Young
Attorney, Agent, or Firm—Francis I. Gray

[57] ABSTRACT

A number format conversion apparatus for signal processing has as inputs an exponent value and a mantissa value, the exponent and mantissa values representing a numerical value for a signal sample. An operator inputs an exponent max/min range and an offset, depending upon what conversion is desired. An output exponent is derived from the input exponent as a function of the maximum and minimum exponent values and the exponent offset. A shift value is derived from an unclipped output exponent and the minimum exponent value. The shift value is applied to a barrel shifter to shift the mantissa value to produce an output mantissa. The output exponent and mantissa form a floating point output number for the signal sample when a floating point output is selected, and the mantissa forms a fixed point output number for the signal sample when a fixed point output is selected. Thus a single circuit, implementable as a block on an ASIC, performs number format conversion between floating point and fixed point number formats.

9 Claims, 2 Drawing Sheets

NUMBER FORMAT CONVERSION APPARATUS FOR SIGNAL PROCESSING

BACKGROUND OF THE INVENTION

The present invention relates to digital signal processing, and more particularly to a number format conversion apparatus for signal processing that supports a variety of fixed and floating point number formats, converting between formats as needed in a signal processing path.

Most digital signal processing is done with signals represented in the form of a series of numerical samples expressed in a fixed point binary number format. The popularity of this format is due to the relative ease with which the most common signal processing operations may be realized in hardware, such as addition, subtraction, comparison and multiplication. Other advantages of this number format that make signals easy to control include good control over rounding errors, a fixed limited range, and a constant resolution over the entire range.

However the fixed range and constant resolution are also great disadvantages for many of the less common signal processing operations, such as squares, square roots, logarithms, exponentials and divides. In order to maintain precision in the result, each of these operations requires either a large expansion or contraction of word size for the numerical samples if a fixed number format is used. For example squaring a sixteen bit number produces a result requiring 32 bits. For these cases, therefore, a floating point number format is more appropriate. Unfortunately it is much more difficult to implement addition, subtraction and comparison operations for a floating point number format, so much so that it would become prohibitively expensive to do so in many cases.

Often in a digital signal processing environment the magnitude of a vector or imaginary number representing a signal is desired. To determine the magnitude two orthogonal vector components are derived from respective signal sources, providing digital integer number values. The integer values are each squared, the squares summed, and the square root of the result is obtained, usually from a read only memory lookup table. Since the read only memory has a limited number of inputs, it is desired to convert the sum of the squares to a floating point number. To take the square root the exponent of the floating point number needs to be limited so that the number of bits that access the lookup table is not excessive. This requires added circuitry to determine the size of the exponent and to limit and shift.

Another example in the digital video effects environment is reverse addressing when determining which combination of pixels from an input frame of a video image needs to be accessed to provide a corresponding pixel at the output. This requires three sources that provide digital integer numbers. The numbers from two of the sources are divided by the number from the third source, which requires converting to a floating point number format. To get the two addresses from the results requires converting back to a fixed point number format. Previously specific circuitry was required for each type of number format.

What is needed is hardware that supports a variety of fixed and floating point number formats, converting between number formats as needed in a signal processing path.

SUMMARY OF THE INVENTION

Accordingly the present invention provides a number format conversion apparatus for signal processing that supports a variety of fixed and floating point number formats, converting between number formats as needed in a signal processing path. The apparatus has two inputs and two outputs, with one input coupled to receive an exponent portion for a floating point number input format or a zero for a fixed point number input format and the other input coupled to receive a mantissa portion for the floating point number input format or the fixed point number for the fixed point number input format. Depending upon the desired output number format, values for a minimum exponent, a maximum exponent and an exponent offset are input as constants to the apparatus. In response to the constants the input number is converted to the desired output number format. One of the outputs provides an exponent value for a floating point number output format or is not used for a fixed point number output format, and the other output provides a mantissa value for the floating point number output format or a fixed point number for the fixed point number output format.

The objects, advantages and other novel features of the present invention are apparent from the following detailed description when read in conjunction with the claims and attached drawing.

DESCRIPTION OF THE PREFERRED EMBODIMENT

Figure 1:
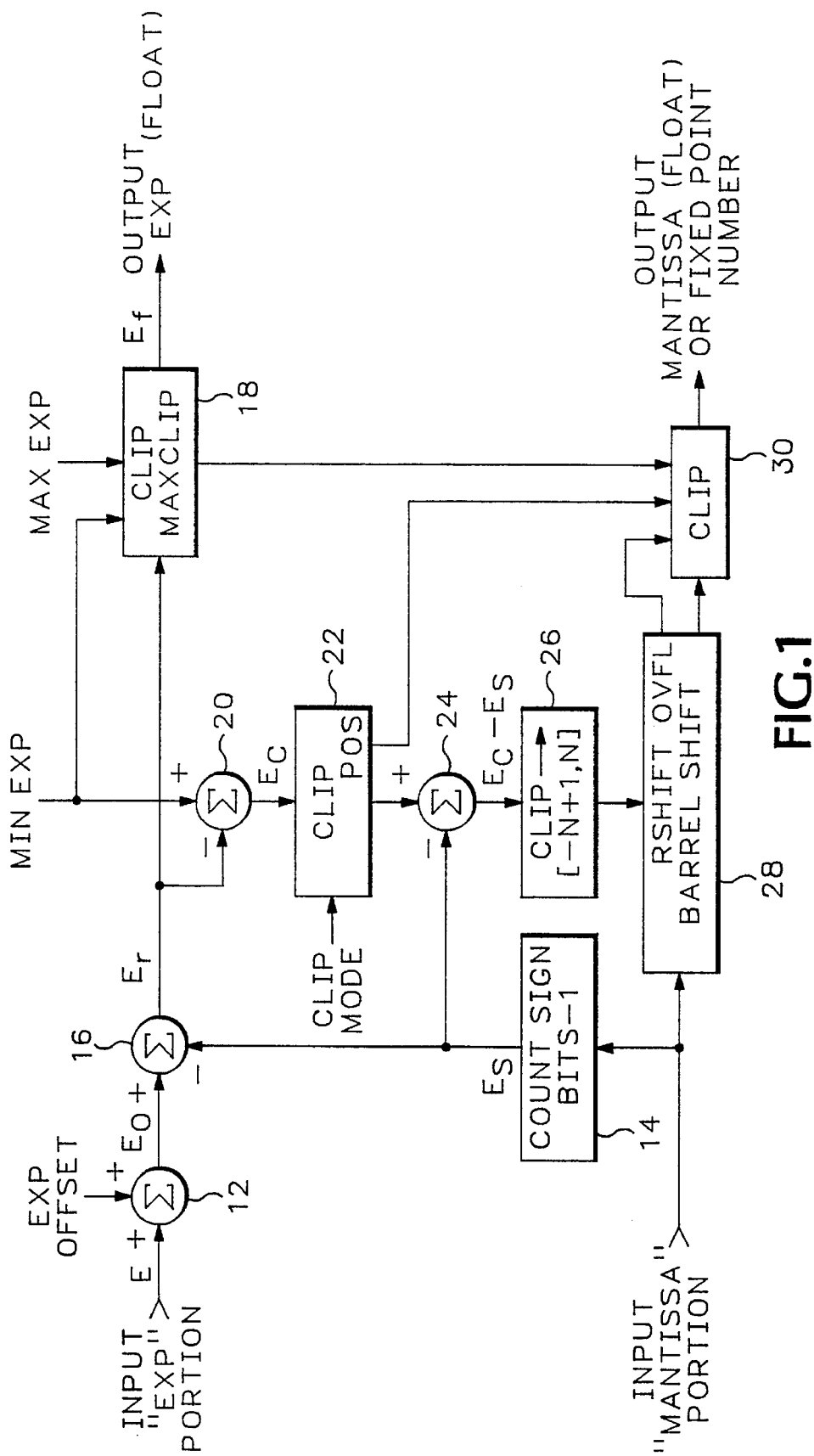
FIG. 1 is a block diagram view of a first embodiment of a number format conversion apparatus for signal processing according to the present invention.

Referring now to FIG. 1 each digital data word representing a signal data point value for an input signal, such as snnnnnnnn×2E in floating point number format, has an exponent portion E of M or fewer bits and a signed mantissa portion snnnnnnn of N or fewer bits. For fixed point numbers the exponent portion E is zero. The exponent portion E is input to an offset summation circuit 12 to which also is input an exponent offset constant. The offset summation circuit 12 allows for adding an exponent bias for floating point input formats, or for defining the binary point position for fixed point input formats, and produces an offset exponent Eo. The mantissa portion in the form of an N bit signed fraction in the range [−1, 1−2(N−1)] is input to a counter 14 that counts the number of sign bits less one to output a shift exponent Es. The offset exponent Eo and the shift exponent Es are input to an output summation circuit 16 where Es is subtracted from Eo to produce an unclipped output exponent Er. The unclipped output exponent Er is then input to an output exponent clip circuit 18 to which also are input user controlled maximum and minimum exponent constants. The unclipped output exponent Er is clipped by the clip circuit 18 to such maximum or minimum exponent constant levels if it falls outside of the desired exponent range to produce a final output exponent Ef.

To set the format of the output mantissa or fixed point number, the unclipped output exponent Er is input together with the minimum exponent constant to a clip summation circuit 20 where it is subtracted from the minimum exponent constant to produce a clip exponent Ec. The clip exponent Ec is input to a clip circuit 22 which is controlled by a clip mode command. For floating point output formats the clip circuit 22 clips negative values to zero. For floating point output formats where gradual underflow is not desired, the clip circuit 22 also provides a POS output signal when positive values are detected. For fixed point output formats negative results are not clipped. The shift exponent value Es is subtracted from the clipped Ec by a shift summation circuit 24 to produce an unclipped shift control signal. The unclipped shift control signal is input to a shift clip circuit 26 to clip the unclipped shift control signal to N if the control signal is greater than N. This clipped shift control signal from the shift clip circuit 26 is input to a sign-extending barrel shifter 28 to which also is input the mantissa portion. The barrel shifter 28 right shifts the mantissa portion according to the clipped shift control signal to produce an unclipped output mantissa signal. The unclipped output mantissa signal is input to an output mantissa clip circuit 30. Also input to the output mantissa clip circuit 30 is a MAXCLIP signal from the output exponent clip circuit 18 generated when the unclipped output exponent Er is clipped by the maximum exponent value, the POS output signal from the clip circuit 22, and an overflow output from the barrel shifter 28, which signals define the clip range. The unclipped output mantissa signal is clipped by the clip circuit 30 to a maximum level, if positive, or a minimum level, if negative, to produce an output mantissa signal in floating point number format or an output fixed point number signal in fixed point number format.

For a fixed point number output format the minimum and maximum exponent constants are both set to −P where P is the number of integer bits, not counting the sign bit, that are to the left of the binary point in the output. For a floating point output the minimum and maximum exponent constants define a range over which the exponent signal of the floating point output may vary. Numbers with exponents that are too large may be clipped to their maximum positive or minimum negative floating point levels. Numbers with exponents too small have the exponent signal clipped to the minimum exponent level and become denormalized, gradually trending toward zero as the level of the exponent signal gets smaller. This process is known as gradual underflow. To support a floating point output format that does not go into gradual underflow for exponent signals less than the minimum exponent constant, the POS output signal from the clip circuit 22 is used to clip the mantissa output signal to zero. To support a fixed point output format that allows the fixed point output signal to overflow without clipping, the MAXCLIP signal and the overflow signal from the barrel shifter 28 are inhibited from causing the output to be clipped to the maximum level.

Figure 2:
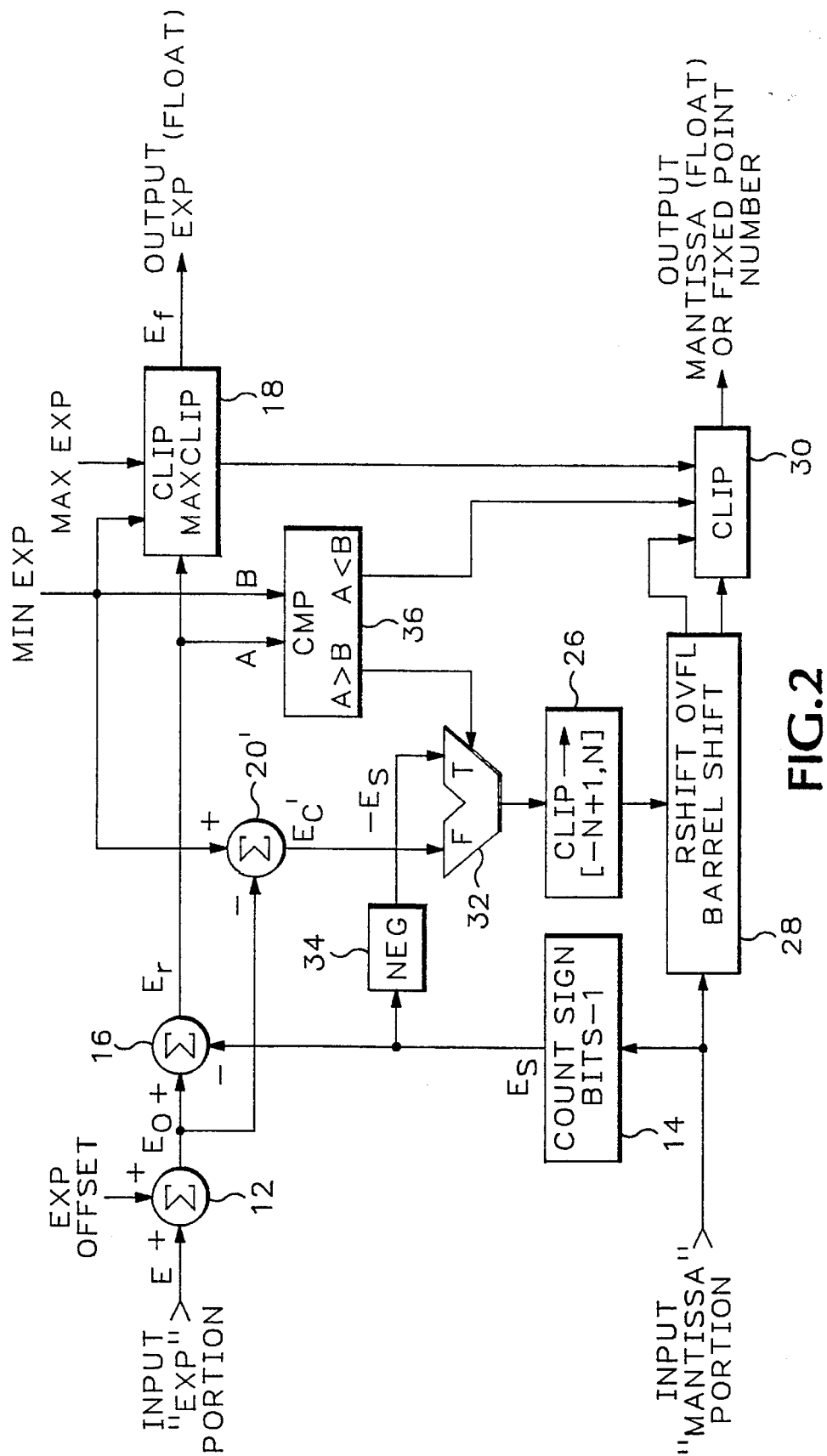
FIG. 2 is a block diagram view of a second embodiment of a number format conversion apparatus for signal processing according to the present invention.

The cascaded adders 12, 16, 20 may be combined by several applications of a well-known method of implementing a three-way add with a single level of three-way half adders which produce sum and carry bits, and then using a single (N−1)-bit adder to add the carries to the sum bits. As shown in FIG. 2 the offset exponent signal Eo may be subtracted from the minimum exponent constant in a shift summation circuit 20', similar to the summation circuit 20 in FIG. 1. The resulting clip exponent signal Ec' may be input to a multiplexer 32, with a second input being the signed exponent signal Es as negated by a negation circuit 34. A comparison circuit 36 compares the unclipped output exponent signal Er with the minimum exponent constant to generate a select signal for the multiplexer 32 and a control signal for the output clip circuit 30. The multiplexer 32 implements the clip to zero of the clip circuit 22 of FIG. 1. The output of the multiplexer 32 is input to the shift clip circuit 26, as in FIG. 1. Of course there are many ways to tweak this design to fit different needs.

In operation for N=8 and an input value of $0.1011010 \times 2^{}-6$ it is desired to convert the exponent range to $[2^{}2, 2^{}-4]$. The maximum exponent constant is set to two, and the minimum exponent constant is set to minus four. The exponent offset constant is set at zero. The exponent constant of −6 is input to the circuit of FIG. 1, and Eo=−6, Es=0, Er=−6 and Ec=2. Since −6 is less than −4, the output exponent signal Ef is clipped to −4. The mantissa portion is shifted to the right two places to produce an output mantissa of 0.0010110, or an output signal data word of $0.0010110 \times 2^{}-4$.

For conversion of the floating point number format signal to fixed point $[2^{**}0]$, the maximum and minimum exponent constants are both set to zero and the exponent offset constant also is set to zero. Then E=−6, Eo=−6, Es=0, Er=−6, Ec=6 and Ef is not used. The mantissa portion is shifted six bits to the right to become 00000001, or 0.0000001 in a fixed point notation, as the output data word for the output mantissa signal.

In another example the exponent range is $[2^{}-8, 2^{}-13]$. Then maximum exponent constant=−8, minimum exponent constant=−13, exponent offset constant=0, E=Eo=−6, Es=0, Er=−6, Ec=−7 (clipped to zero) and Ef=−8. The mantissa portion is clipped to its maximum in the output clip circuit 30 to produce an output mantissa signal data word of 0.1111111. The floating point number output data word becomes $0.1111111 \times 2^{**}-8$.

As a final example the exponent range is limited to $[2^{}14, 2^{}-7]$. Then the maximum exponent constant is 14, the minimum exponent constant is minus seven, the exponent offset constant is zero, E=Eo=−6, Es=0, Er=−6, Ef=−6 and Ec=−1 (clipped to zero). The mantissa portion is unshifted so that the output floating point number data word equals the input floating point number data word, namely $0.1011010 \times 2^{**}-6$.

For a fixed point input data word, such as 0101.1010, to be converted to a floating point number data word with exponents in the range $[2^{}4, 2^{}-1]$, the maximum exponent constant is four, the minimum exponent constant is minus one, the exponent offset constant is three to indicate the position of the binary point in the fixed point input format, E=0, Eo=3, Es=0, Er=3, Ec=−4 and Ef=3. Since Ec gets clipped to zero, the input remains unshifted and becomes the output mantissa data word. The floating point output data word becomes $0.1011010 \times 2^{**}3$.

For the vector magnitude situation discussed previously two 16-bit integer signals, X and Y, may be input to respective multipliers to produce the squares of X and Y, each having 32 bits. The squares of X and Y are then input to a summing circuit to produce the sum of the squares with 33 bits. The 33-bit integer digital data word is then input to the number format conversion apparatus of the present invention to produce a 16-bit floating point digital data word which is used as an address to access a read only memory lookup table which outputs the resulting square root as a fixed point format data word. The multipliers, summation circuit and number format conversion apparatus may be implemented on a single ASIC in hardware. Likewise the number format conversion apparatus may be implemented on a single ASIC in conjunction with a divider circuit to convert the integer data words to floating point data words for the division and then back to fixed point data words for output.

Thus the present invention provides an ASIC implementable number format conversion apparatus for signal processing which receives as inputs signals digital data words in a first number format and outputs an exponent signal and a mantissa/fixed point signal as a function of a designated exponent range and an exponent offset constant according to a second number format, allowing conversion of input signal data words from fixed to floating, floating to fixed, or floating to floating data words.

What is claimed is:

1. An apparatus for converting an input digital signal having a first numerical format to an output digital signal having a second numerical format comprising:

means for generating a digital exponent signal from the input digital signal, an exponent range and an exponent offset, the exponent range and the exponent offset being determined by the first and second numerical formats; and means for generating a digital mantissa signal from the input digital signal, the exponent range and the exponent offset, the digital exponent and digital mantissa signals providing the output digital signal when the second numerical format is a floating point numerical format and the digital mantissa signal providing the output digital signal when the second numerical format is a fixed point numerical format.

2. The apparatus as recited in claim 1 wherein the digital exponent signal generating means comprises:

means for combining a digital exponent portion of the digital signal with a digital exponent offset constant and a sign bit portion of the digital signal to produce an intermediate exponent signal; and mean for clipping the intermediate exponent signal as a function of an exponent range to produce the digital exponent signal, the exponent range being defined by a digital minimum exponent constant and a digital maximum exponent constant.

3. The apparatus as recited in claim 2 wherein the combining means comprises:

a first summation circuit for summing the digital offset exponent constant with the digital exponent portion to produce an offset exponent signal;

means for producing a shift exponent signal from the sign portion; and a second summation circuit for subtracting the shift exponent signal from the offset exponent signal to produce the intermediate exponent signal.

4. The apparatus as recited in claim 2 wherein the digital mantissa signal generating means comprises:

means for generating a shift control signal as a function of the intermediate exponent signal, the digital minimum exponent constant and the sign bit portion; and means for producing the digital output mantissa signal from the digital mantissa portion as a function of the shift control signal.

5. The apparatus as recited in claim 4 wherein the shift control signal generating means comprises:

means for generating a clipped exponent signal from the intermediate exponent signal as a function of the digital minimum exponent constant; and means for producing the shift control signal from the clipped exponent signal as a function of the sign bit portion.

6. The apparatus as recited in claim 5 wherein the clipped exponent signal generating means comprises:

a third summation circuit for subtracting the intermediate exponent signal from the digital minimum exponent constant to produce a clip exponent signal; and means for clipping the clip exponent signal to produce the clipped exponent signal.

7. The apparatus as recited in claim 5 wherein the shift control signal producing means comprises:

means for extracting a shift exponent signal from the sign bit portion;

a fourth summation circuit for subtracting the shift exponent signal from the clipped exponent signal to produce a shift control exponent signal; and means for clipping the shift control exponent signal to produce the shift control signal.

8. The apparatus as recited in claim 4 wherein the shift control signal generating means comprises:

a third summation circuit for subtracting the offset exponent signal from the digital minimum exponent constant to produce a clip exponent signal;

means for comparing the intermediate exponent signal with the digital minimum exponent constant to produce a select signal;

means for selecting between a negated shift exponent signal derived from the sign bit portion and the clip exponent signal as a function of the select signal to produce a shift control exponent signal; and means for clipping the shift control exponent signal to produce the shift control signal.

9. An apparatus for converting an input digital signal in a first numerical format into an output digital signal in a second numerical format comprising:

means for adding a digital offset exponent constant to a digital exponent signal portion of the input digital signal to produce an offset exponent signal, the exponent signal portion being zero when the first numerical format is a fixed point number format;

means for extracting from the input digital signal a shift exponent signal;

means for subtracting the shift exponent signal from the offset exponent signal to produce an output exponent signal;

means for clipping the output exponent signal to an exponent range defined by a minimum exponent digital constant and a maximum exponent digital constant to produce a final output exponent signal;

means for subtracting the output exponent signal from the minimum exponent digital constant to produce a clip exponent signal;

means for clipping the clip exponent signal to produce a clipped exponent signal;

means for subtracting the shift exponent signal from the clipped exponent signal to produce a shift control signal;

means for limiting the shift control signal to produce a limited shift control signal;

means for shifting the input digital signal under control of the limited shift control signal to produce an output mantissa signal; and means for clipping the output mantissa signal as a function of a maxclip signal from the output exponent signal clipping means, a positive signal from the clip exponent signal clipping means, and an overflow signal from the shifting means to produce a final output mantissa signal, the output digital signal being the final output exponent and mantissa signals when the second numerical format is a floating point number format and the output digital signal being the final output mantissa signal when the second numerical format is a fixed point number format.

* * * * *